(12) United States Patent
Ding et al.

(10) Patent No.: US 9,313,934 B2
(45) Date of Patent: Apr. 12, 2016

(54) DISPENSIBLE ELECTRICAL GASKET, ELECTRONIC MODULE HAVING DISPENSIBLE ELECTRICAL GASKET, AND METHOD OF FABRICATING SAME

(71) Applicant: Autoliv ASP Inc., Ogden, UT (US)

(72) Inventors: Xueru Ding, Newton, MA (US); Richard Leung, Westford, MA (US)

(73) Assignee: Autoliv ASP, Inc., Ogden, UT (US)

( * ) Notice: Subject to any disclaimer, the term of this patent is extended or adjusted under 35 U.S.C. 154(b) by 511 days.

(21) Appl. No.: 13/834,868

(22) Filed: Mar. 15, 2013

(65) Prior Publication Data

US 2014/0266903 A1    Sep. 18, 2014

(51) Int. Cl.
| | |
|---|---|
| *H05K 9/00* | (2006.01) |
| *G01S 7/02* | (2006.01) |
| *G01S 7/03* | (2006.01) |
| *G01S 13/93* | (2006.01) |

(52) U.S. Cl.
CPC .............. *H05K 9/0015* (2013.01); *G01S 7/023* (2013.01); *G01S 7/032* (2013.01); *G01S 13/931* (2013.01); *Y10T 29/49155* (2015.01)

(58) Field of Classification Search
CPC ........ G06F 1/181; G06F 1/182; H05K 7/1427
USPC .............. 342/13, 14, 385; 361/728, 751, 752; 29/846
See application file for complete search history.

(56) References Cited

U.S. PATENT DOCUMENTS

| | | | |
|---|---|---|---|
| 6,366,245 | B1 | 4/2002 | Schmidt et al. |
| 6,624,432 | B1 | 9/2003 | Gabower et al. |
| 2010/0041273 | A1* | 2/2010 | Scherer .............. H01R 23/6873 439/607.01 |
| 2011/0304996 | A1* | 12/2011 | Wu ....................... G02B 6/4261 361/752 |
| 2013/0012038 | A1* | 1/2013 | Kirk ..................... H01R 12/724 439/55 |
| 2013/0147657 | A1 | 6/2013 | Lee et al. | |

FOREIGN PATENT DOCUMENTS

| | | |
|---|---|---|
| EP | 0 642 190 B1 | 1/1999 |
| WO | 2013055272 A1 | 4/2013 |

* cited by examiner

*Primary Examiner* — Dao Phan
(74) *Attorney, Agent, or Firm* — Steven M. Mills; Burns & Levinson, LLP (57) ABSTRACT

An electronic module and method of making an electronic module include a printed circuit board (PCB) having a surface, at least one conductive trace being formed on the surface. A housing element for mechanically mating with the PCB includes at least one mating surface aligned with the conductive trace on the PCB when the PCB and the housing element are mechanically mated, the mating surface comprising a plurality of alternating protrusions and spaces between the protrusions. An electrical gasket is formed on the mating surface of the housing element such that the electrical gasket conforms with the protrusions and spaces on the mating surface of the housing element and is disposed between the mating surface of the housing element and the conductive trace on the surface of the PCB when the housing element and the PCB are mechanically mated, such that the electrical gasket provides an electromagnetic interference (EMI) seal between the mating surface of the housing element and the conductive trace on the first surface of the PCB.

24 Claims, 7 Drawing Sheets

Prior Art

DISPENSIBLE ELECTRICAL GASKET, ELECTRONIC MODULE HAVING DISPENSIBLE ELECTRICAL GASKET, AND METHOD OF FABRICATING SAME

BACKGROUND

1. Technical Field

This application relates to electronic equipment, and, in particular, to radio-frequency interference (RFI) and/or electromagnetic interference (EMI) shielding in electronic equipment, and methods of making electronic equipment with RFI and EMI shielding.

2. Discussion of Related Art

Electronic systems or modules can typically include one or more printed circuit boards (PCBs) populated with electronic circuits and devices. The PCB(s) can be contained within a housing which can have one or more covers which mate together to enclose the PCB(s). Similarly, one or more of the PCB(s) can mate with one or more of the covers of the housing. In some electronic systems or modules, it is important that the internal electronic circuitry be shielded from RFI and EMI, both to prevent RFI and/or EMI in the external environment from interfering with the internal electronic circuitry and to prevent the electronic systems or modules from emitting signals into the external environment.

Typically, to prevent RFI and/or EMI, the mating covers of the housing and/or the mating covers and PCB(s) of the system are made of or coated with a conductive material. When the covers are mated together or when the PCB(s) and cover(s) are mated together, an electrical gasket, which can also include a conductive material, can be interposed between them to provide an electrical seal. As a result, the circuitry can be completely enclosed by conductive material, which can be connected to the electrical ground of the system. This results in a complete shield against RFI and EMI.

In some electrical systems with such a shielding configuration, such as, for example, automotive radar sensor systems/modules, the gasket interposed between a PCB within the module and a cover of the module creates mechanical stresses on the PCB when it is attached to the housing cover. These stresses can cause damage to the PCB and can adversely affect the quality of the electrical seal and, therefore, performance of the system.

SUMMARY

According to one aspect, an electronic module is provided. The electronic module includes a printed circuit board (PCB) having a surface, at least one conductive trace being formed on the surface. The module also includes a housing element for mechanically mating with the PCB, the housing element comprising at least one mating surface aligned with the conductive trace on the PCB when the PCB and the housing element are mechanically mated, the mating surface comprising a plurality of alternating protrusions and spaces between the protrusions. An electrical gasket is formed on the mating surface of the housing element such that the electrical gasket conforms with the protrusions and spaces on the mating surface of the housing element and is disposed between the mating surface of the housing element and the conductive trace on the surface of the PCB when the housing element and the PCB are mechanically mated, such that the electrical gasket provides an electromagnetic interference (EMI) seal between the mating surface of the housing element and the conductive trace on the first surface of the PCB.

In some exemplary embodiments, the electronic module is an automotive radar sensor module.

In some exemplary embodiments, the housing element is formed of a material comprising metal. In some exemplary embodiments, the metal is aluminum.

In some exemplary embodiments, the housing element is formed of a plastic material.

In some exemplary embodiments, the housing element comprises a conductive coating. In some exemplary embodiments, the conductive coating is conductive paint.

In some exemplary embodiments, the electrical gasket comprises a soft conductive elastomer material.

In some exemplary embodiments, the protrusions and spaces on the mating surface of the housing element have a sawtooth pattern.

In some exemplary embodiments, the protrusions and spaces on the mating surface of the housing element have a substantially rectangular shape.

In some exemplary embodiments, the protrusions and spaces on the mating surface of the housing element have a substantially trapezoidal shape.

According to another aspect, a method of making an electronic module is provided. The method includes: forming at least one conductive trace on a surface of a printed circuit board (PCB); forming at least one mating surface on a housing element for mechanically mating with the PCB, the at least one mating surface being formed to be aligned with the conductive trace on the PCB when the PCB and the housing element are mechanically mated, the mating surface being formed with a plurality of alternating protrusions and spaces between the protrusions; and forming an electrical gasket on the mating surface of the housing element such that the electrical gasket conforms with the protrusions and spaces on the mating surface of the housing element and is disposed between the mating surface of the housing element and the conductive trace on the surface of the PCB when the housing element and the PCB are mechanically mated, such that the electrical gasket provides an electromagnetic interference (EMI) seal between the mating surface of the housing element and the conductive trace on the first surface of the PCB.

In some exemplary embodiments, the electronic module is an automotive radar sensor module.

In some exemplary embodiments, the housing element is formed of a material comprising metal. In some exemplary embodiments, the metal is aluminum.

In some exemplary embodiments, the housing element is formed of a plastic material.

In some exemplary embodiments, the method further comprises applying a conductive coating to at least a portion of the housing element. In some exemplary embodiments, the conductive coating is conductive paint.

In some exemplary embodiments, the electrical gasket comprises a soft conductive elastomer material.

In some exemplary embodiments, forming the electrical gasket comprises: dispensing a fluid gasket material onto the mating surface of the housing element such that the fluid gasket material conforms with the protrusions and spaces on the mating surface of the housing element; and allowing the fluid gasket material to dry to a solid gasket material.

In some exemplary embodiments, forming the at least one mating surface on the housing comprises molding the mating surface while molding the housing.

In some exemplary embodiments, the protrusions and spaces on the mating surface of the housing element are formed in a sawtooth pattern.

In some exemplary embodiments, the protrusions and spaces on the mating surface of the housing element are formed to have a substantially rectangular shape.

In some exemplary embodiments, the protrusions and spaces on the mating surface of the housing element are formed to have a substantially trapezoidal shape.

BRIEF DESCRIPTION OF THE DRAWINGS

The foregoing and other features and advantages will be apparent from the more particular description of preferred embodiments, as illustrated in the accompanying drawings, in which like reference characters refer to the same parts throughout the different views. The drawings are not necessarily to scale, emphasis instead being placed upon illustrating the principles of the inventive concept.

DETAILED DESCRIPTION

Figure 1:
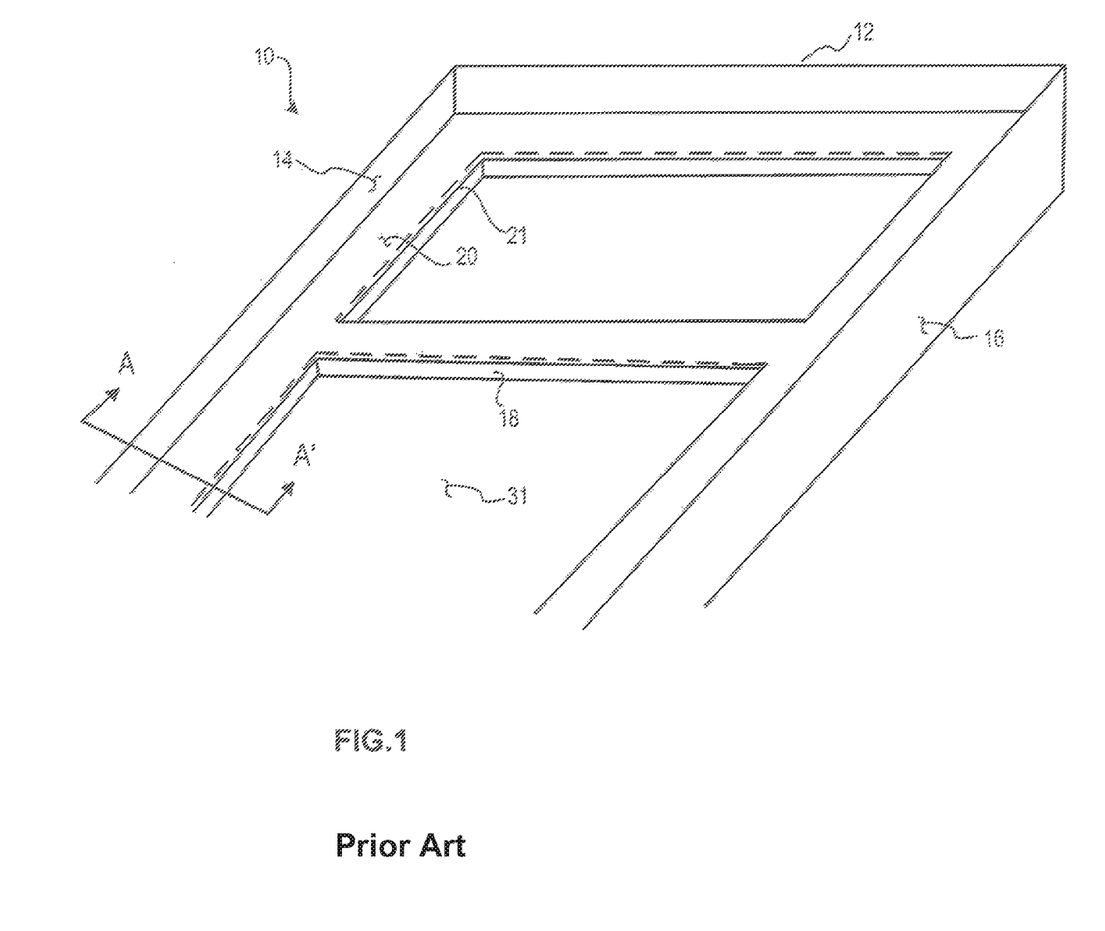
FIG. 1 includes a schematic perspective view of a portion of a top or bottom cover of a housing of a conventional electronic system or module.

FIG. 1 includes a schematic perspective view of a portion of a top or bottom cover 10 of a housing of a conventional electronic system or module. Cover 10 includes a vertical wall 12 having an inner surface 14 and an outer surface 16, as well as a top or bottom cover surface 31. Cover 10 can be formed of an electrically conductive material, such as a metal, e.g., aluminium. Cover 10 can alternatively be formed of a non-conductive material such as plastic and coated with a conductive material such as conductive paint. Cover 10 can also include a shelf portion 18 on which a PCB can be mounted. Shelf portion 18 can be integrally formed with cover 10 such as by being molded in the same molding step as cover 10. Shelf 18 can include a mating surface 20, on which an electrical gasket 21 (shown in phantom) can be disposed. The electrical gasket 21 can be made of a conductive material, such as a soft conductive elastomer material, which mates with a surface of the PCB when the PCB is installed in cover 10.

Figure 2:
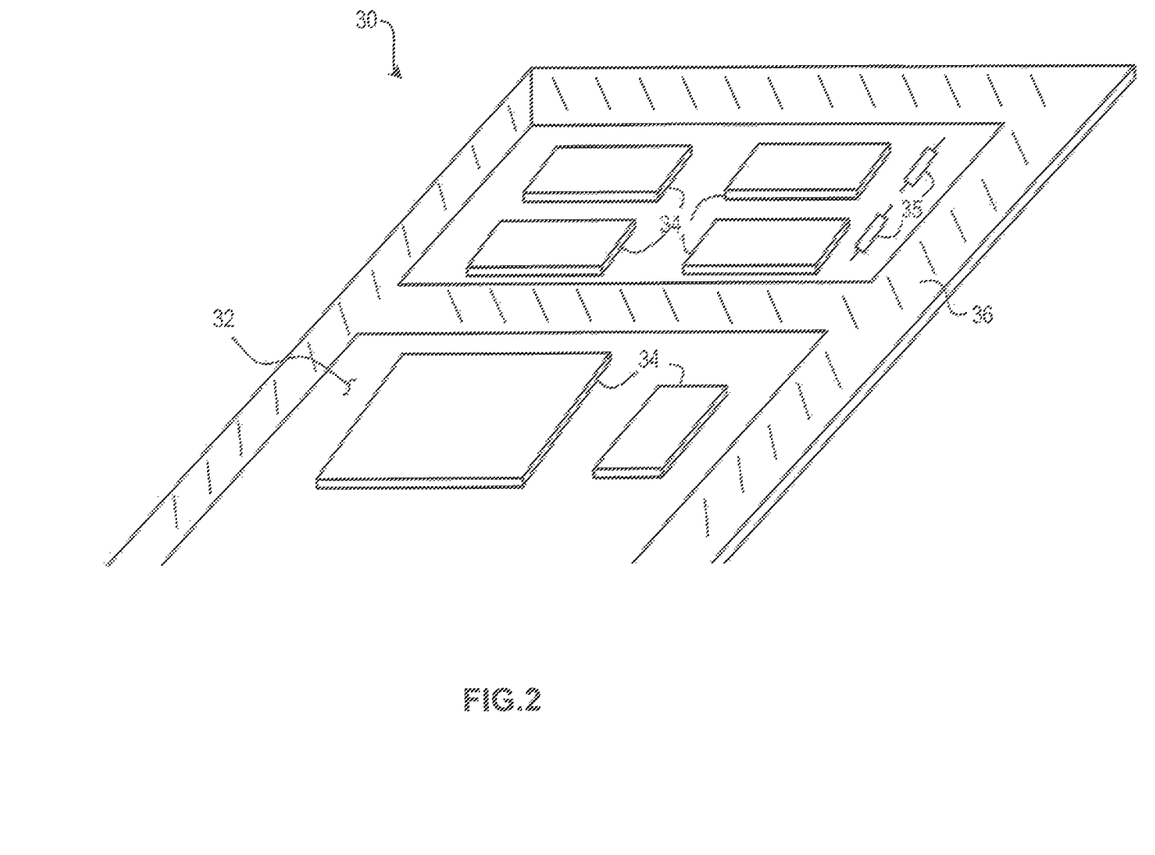
FIG. 2 includes a schematic perspective view of an exemplary printed circuit board (PCB), which can be installed in and mated with the cover illustrated in FIG. 1.

FIG. 2 includes a schematic perspective view of an exemplary printed circuit board (PCB) 30, which can be installed in and mated with cover 10 illustrated in FIG. 1. Referring to FIG. 2, PCB 30 includes a front side, or top side or device side 32 on which can be mounted one or more integrated circuits (ICs) 34 and/or discrete electronic devices 35. ICs 34 and discrete devices 35 can be connected by a conductor pattern printed on one or more layers and/or surfaces of PCB 30. The conductor pattern can include a conductive trace 36 formed on surface 32 of PCB 30. Conductive trace 36 can be connected to system ground and, therefore, can be considered a ground plane formed on PCB 30.

When cover 10 of FIG. 1 and PCB 30 of FIG. 2 are mated together, the orientation of one of cover 10 and PCB 30 is opposite to that illustrated in FIGS. 1 and 2, respectively. That is, for example, PCB 30 is flipped over 180 degrees such that surface 32 faces cover 10, thus allowing conductive trace 36 on PCB 30 to make electrical contact with mating surface 20 of shelf 18 formed in cover 10 through electrical gasket 21. When assembled, PCB 30 and cover 10 are held firmly together in place by some rigid fastening means such as, for example, screws and threaded holes (not shown), against electrical gasket 21. The intent of this configuration is to provide an electrical seal between cover 10 and PCB 30 such that an EMI shield of ICs 34 and discrete devices 35 is provided.

In many systems, the flat electrical gasket 21 can introduce mechanical stresses into the PCB 30 at the junction of cover 10 and PCB 30. These stresses can result in bending and warping of PCB 30 and/or cover 10, such that a complete electrical seal is not provided. This results in degrading the EMI shielding provided for the system.

Figure 3:
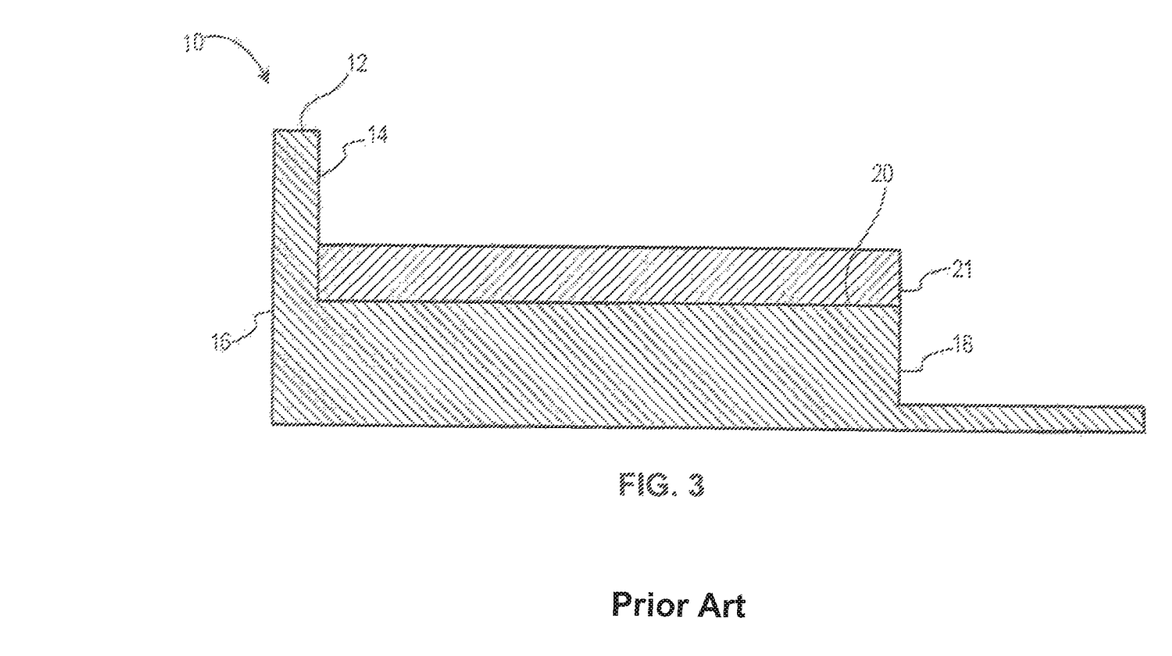
FIG. 3 includes a schematic cross-sectional view taken along line A-A' of FIG. 1.

FIG. 3 includes a schematic cross-sectional view taken along line A-A' of FIG. 1. Referring to FIG. 3, cover 10 is illustrated with vertical wall 12, having inner surface 14 and outer surface 16. Cover 10 includes integral shelf portion 18 having mating surface 20 for supporting PCB 30 (FIG. 2). Electrical gasket 21 is disposed on mating surface 20 of shelf portion 18. Electrical gasket 21 can be formed by dispensing a fluid electrical gasket material, which can be, for example, a soft conductive elastomer, and then allowing the fluid gasket material to dry into solid electrical gasket 21.

As illustrated in FIG. 3, electrical gasket 21 includes a flat, continuous top surface. As a result, when PCB 30 is secured to electrical gasket 21, PCB 30 will be forced to conform to the flat continuous surface. This can cause bending and warping stresses to be introduced into PCB 30, which can result in damage to PCB 30 and in an incomplete electrical seal being formed by electrical gasket 21.

Figure 4:
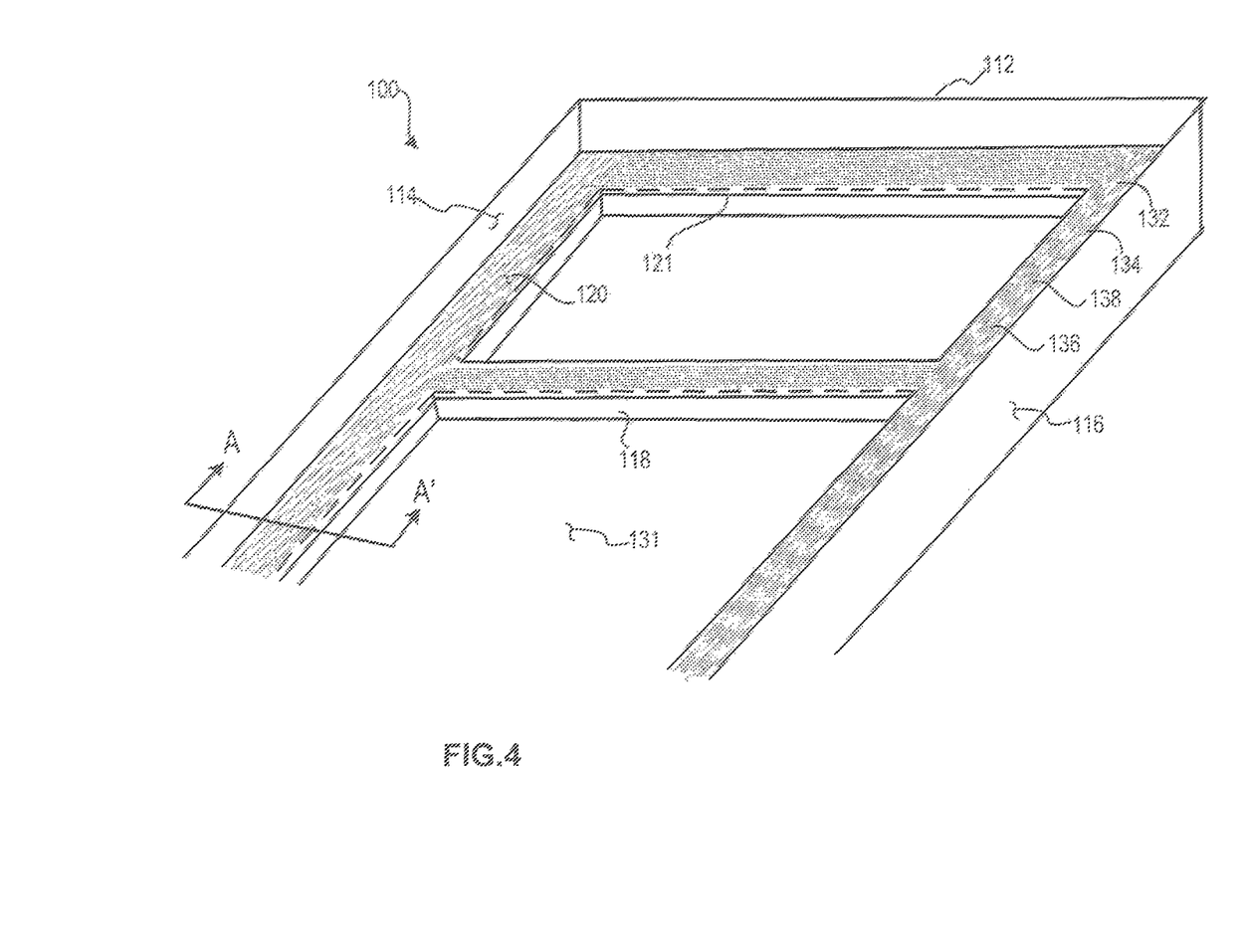
FIG. 4 includes a schematic perspective view of a portion of a top or bottom cover of a housing of an electronic system or module, according to some exemplary embodiments.

According to some exemplary embodiments, a dispensible electrical gasket is provided which is not flat. Therefore, the PCB is not prone to the warping and bending stresses caused by a flat electrical gasket 21. FIG. 4 includes a schematic perspective view of a portion of a top or bottom cover 100 of a housing of an electronic system or module, according to some exemplary embodiments. In some exemplary embodiments, the system or module is a radar sensor module for an automotive radar system. Cover 100 includes a vertical wall 112 having an inner surface 114 and an outer surface 116, as well as a top or bottom cover surface 131. Cover 100 can be formed of an electrically conductive material, such as a metal, e.g., aluminium. Cover 100 can alternatively be formed of a non-conductive material such as plastic and coated with a conductive material such as conductive paint. Cover 100 can also include a shelf portion 118 on which PCB 30 (FIG. 2) can be mounted. Shelf portion 118 can be integrally formed with cover 100 such as by being molded in the same molding step as cover 100. Shelf 118 can include a mating surface 120, on which an electrical gasket 121 (shown in phantom), according to exemplary embodiments, can be disposed. Electrical gasket 121 can be made of a conductive material, such as a soft conductive elastomer, which mates with a surface of PCB 30 when PCB 30 is installed in cover 100.

Referring to FIG. 4, mating surface 120 is not a flat, smooth, continuous surface as in the conventional system illustrated in FIG. 1. In contrast, according to some exemplary embodiments, mating surface 120 is formed with a plurality of ribs or protrusions 132 alternating with spaces or gaps 134 between ribs or protrusions 132. In some exemplary embodiments, electrical gasket 121 disposed on mating surface 120 at least partially conforms with ribs 132 and spaces 134 of mating surface 120, such that electrical gasket 121 also includes ribs or protrusions 136 alternating with spaces or gaps 138 between ribs or protrusions 136. Since electrical gasket 121 does not have a continuous, flat surface, when PCB 30 (FIG. 2) is mated with cover 100, PCB 30 does not need to conform with a flat, continuous surface. Instead, it contacts electrical gasket 121 at ribs 136. As a result, the warping and bending stresses of the conventional system illustrated in FIG. 1 are eliminated. According to these exemplary embodiments, an improved electrical seal is obtained.

As described above, in some exemplary embodiments, electrical gasket 121 at least partially conforms with ribs 132 and spaces 134 of mating surface 120. In some embodiments, electrical gasket 121 is formed by dispensing a fluid gasket material on mating surface 120. The fluid gasket material can be, for example, a soft conductive elastomer. The dispensed fluid gasket material conforms to the shape of mating surface 120 and is allowed to dry and solidify. The resulting electrical gasket 121 also includes ribs 136 and spaces 138, which contact conductive trace 36 on PCB 30 (FIG. 2) when the system is assembled.

Figure 5:
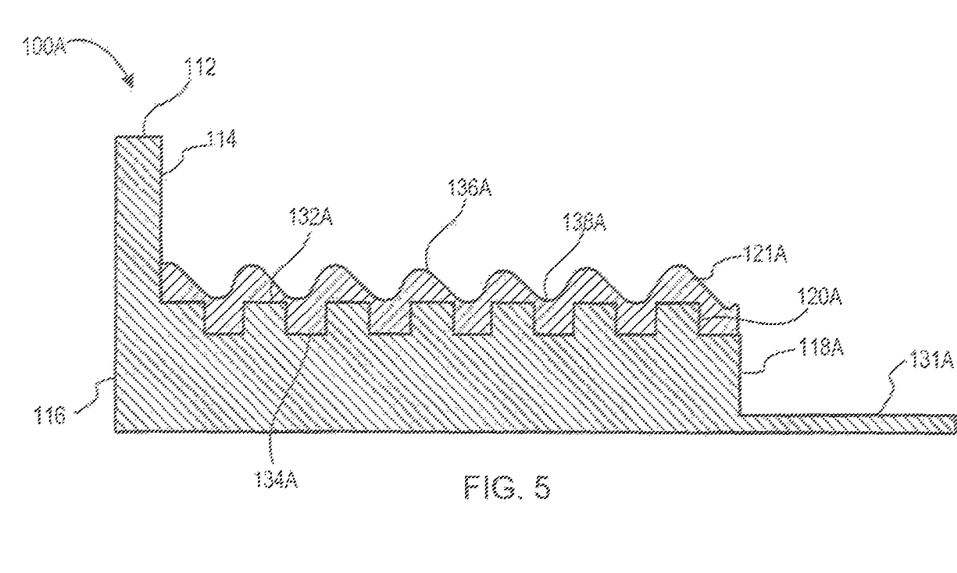
FIGS. 5-7 include schematic cross-sectional views taken along line A-A' of FIG. 4, illustrating various mating surfaces and electrical gaskets, according to exemplary embodiments.
Figure 6:
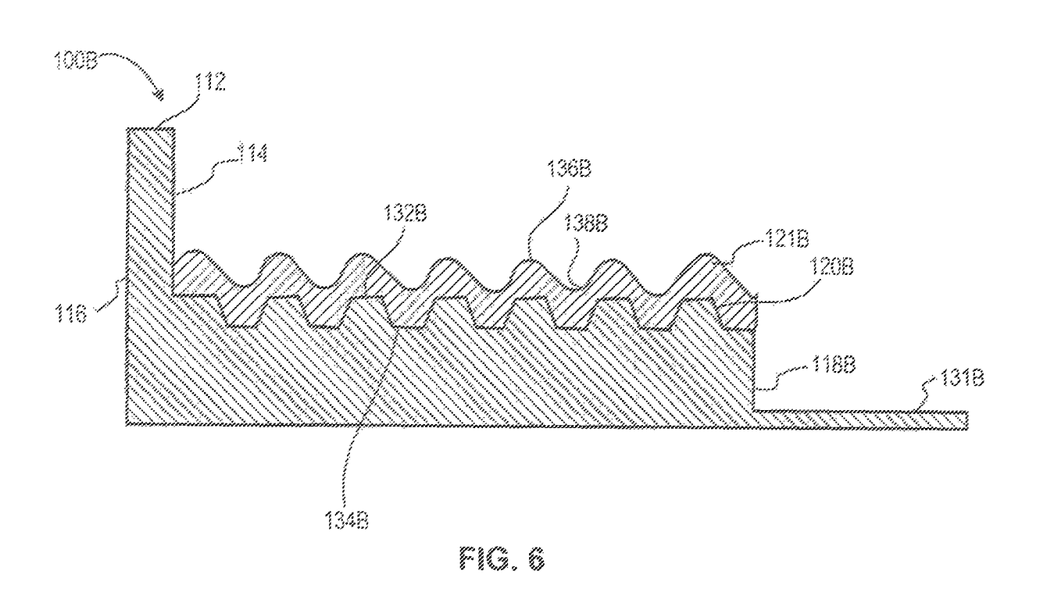
Figure 7:
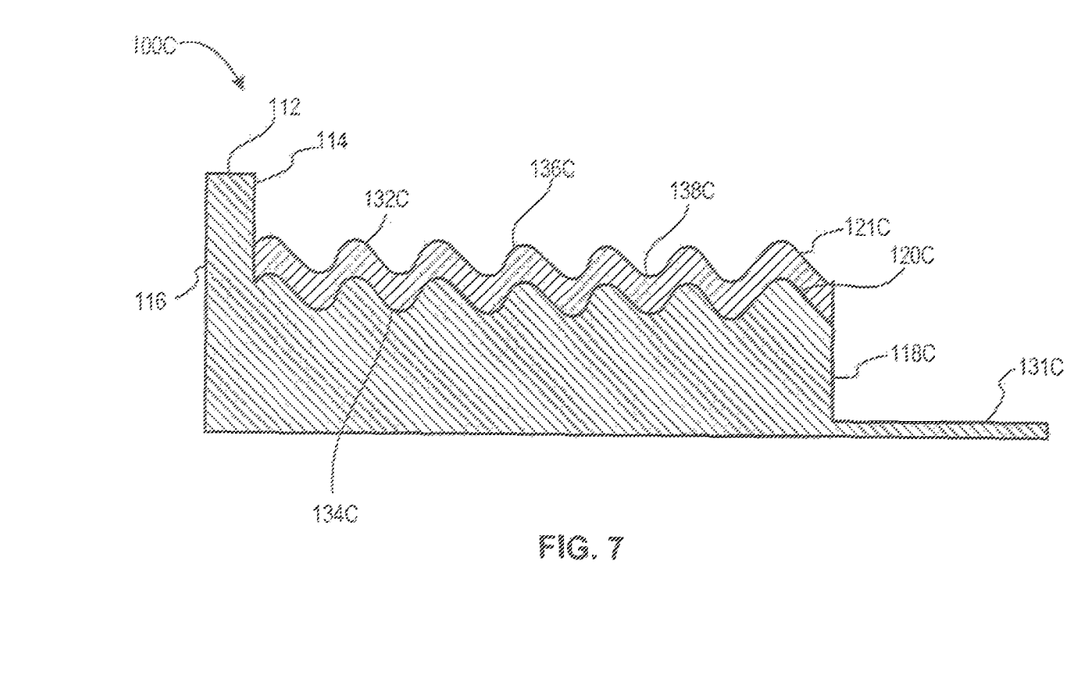

FIGS. 5-7 include schematic cross-sectional views taken along line A-A' of FIG. 4, illustrating various mating surfaces 120 and electrical gaskets 121, according to exemplary embodiments. Referring to FIG. 5, cover 100A includes vertical wall 112, having inner surface 114, outer surface 116 and top or bottom cover surface 131A. Shelf 118A includes mating surface 120A, and electrical gasket 121A is disposed on mating surface 120A. Mating surface 120A is formed to have ribs or protrusions 132A alternating with spaces or gaps 134A between ribs or protrusions 132A. In the exemplary embodiment illustrated in FIG. 5, ribs 132A and spaces 134A are substantially rectangular in cross-sectional shape. Electrical gasket 121A formed on mating surface 120A at least partially conforms with mating surface 120A such that electrical gasket 121A also includes ribs or protrusions 136A alternating with spaces or gaps 138A between ribs or protrusions 136A. In some embodiments, the alternating ribs 136A and spaces 138A can be viewed to have a modified sawtooth shape in cross-section.

Referring to FIG. 6, cover 100B includes vertical wall 112, having inner surface 114, outer surface 116 and top or bottom cover surface 131B. Shelf 118B includes mating surface 120B, and electrical gasket 121B is disposed on mating surface 120B. Mating surface 120B is formed to have ribs or protrusions 132B alternating with spaces or gaps 134B between ribs or protrusions 132B. In the exemplary embodiment illustrated in FIG. 6, ribs 132B are substantially trapezoidal in cross-sectional shape. Electrical gasket 121B formed on mating surface 120B at least partially conforms with mating surface 120B such that electrical gasket 121B also includes ribs or protrusions 136B alternating with spaces or gaps 138B between ribs or protrusions 136B. In some embodiments, the alternating ribs 136B and spaces 138B can be viewed to have a modified sawtooth shape in cross-section.

Referring to FIG. 7, cover 100C includes vertical wall 112, having inner surface 114, outer surface 116 and top or bottom cover surface 131C. Shelf 118C includes mating surface 120C, and electrical gasket 121C is disposed on mating surface 120C. Mating surface 120C is formed to have ribs or protrusions 132C alternating with spaces or gaps 134C between ribs or protrusions 132C. In the exemplary embodiment illustrated in FIG. 7, ribs 132C and spaces 134C can be viewed to have a modified sawtooth shape in cross-section. Electrical gasket 121C formed on mating surface 120C at least partially conforms with mating surface 120C such that electrical gasket 121C also includes ribs or protrusions 136C alternating with spaces or gaps 138C between ribs or protrusions 136C. In some embodiments, the alternating ribs 136C and spaces 138C can be viewed to have a modified sawtooth shape in cross-section.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

For example, in FIG. 4, shelf portion 118 has a particular size and shape. It is shown by way of example only to be formed adjacent to the entire inner surface 114 of vertical wall 112. It is also shown to have a web portion connecting the portions adjacent to vertical wall 112. It will be understood that this particular configuration of shelf 118 and, therefore, mating surface 120, is exemplary only and is intended to illustrate that shelf 118 and mating surface 120 can have any configuration, including adjacent to wall 112 and in a connecting web configuration as illustrated in FIG. 4, but also in other configurations, such as standing alone on surface 131 of cover 100, or other configurations.

The invention claimed is:

1. An electronic module, comprising:
   a printed circuit board (PCB) having a surface, at least one conductive trace being formed on the surface;
   a housing element for mechanically mating with the PCB, the housing element comprising at least one mating surface aligned with the conductive trace on the PCB when the PCB and the housing element are mechanically mated, the mating surface comprising a plurality of alternating protrusions and spaces between the protrusions; and
   an electrical gasket formed on the mating surface of the housing element such that the electrical gasket conforms with the protrusions and spaces on the mating surface of the housing element and is disposed between the mating surface of the housing element and the conductive trace on the surface of the PCB when the housing element and the PCB are mechanically mated, such that the electrical gasket provides an electromagnetic interference (EMI) seal between the mating surface of the housing element and the conductive trace on the first surface of the PCB.

2. The electronic module of claim 1, wherein the electronic module is an automotive radar sensor module.

3. The electronic module of claim 1, wherein the housing element is formed of a material comprising metal.

4. The electronic module of claim 3, wherein the metal is aluminum.

5. The electronic module of claim 1, wherein the housing element is formed of a plastic material.

6. The electronic module of claim 5, wherein the housing element comprises a conductive coating.

7. The electronic module of claim 6, wherein the conductive coating is conductive paint.

8. The electronic module of claim 1, wherein the electrical gasket comprises a soft conductive elastomer material.

9. The electronic module of claim 1, wherein the protrusions and spaces on the mating surface of the housing element have a sawtooth pattern.

10. The electronic module of claim 1, wherein the protrusions and spaces on the mating surface of the housing element have a substantially rectangular shape.

11. The electronic module of claim 1, wherein the protrusions and spaces on the mating surface of the housing element have a substantially trapezoidal shape.

12. A method of making an electronic module, comprising:
   forming at least one conductive trace on a surface of a printed circuit board (PCB);
   forming at least one mating surface on a housing element for mechanically mating with the PCB, the at least one mating surface being formed to be aligned with the conductive trace on the PCB when the PCB and the housing element are mechanically mated, the mating surface being formed with a plurality of alternating protrusions and spaces between the protrusions; and
   forming an electrical gasket on the mating surface of the housing element such that the electrical gasket conforms with the protrusions and spaces on the mating surface of the housing element and is disposed between the mating surface of the housing element and the conductive trace on the surface of the PCB when the housing element and the PCB are mechanically mated, such that the electrical gasket provides an electromagnetic interference (EMI) seal between the mating surface of the housing element and the conductive trace on the first surface of the PCB.

13. The method of claim 12, wherein the electronic module is an automotive radar sensor module.

14. The method of claim 12, wherein the housing element is formed of a material comprising metal.

15. The method of claim 14, wherein the metal is aluminum.

16. The method of claim 12, wherein the housing element is formed of a plastic material.

17. The method of claim 16, further comprising applying a conductive coating to at least a portion of the housing element.

18. The method of claim 17, wherein the conductive coating is conductive paint.

19. The method of claim 11, wherein the electrical gasket comprises a soft conductive elastomer material.

20. The method of claim 12, wherein forming the electrical gasket comprises:
   dispensing a fluid gasket material onto the mating surface of the housing element such that the fluid gasket material conforms with the protrusions and spaces on the mating surface of the housing element; and
   allowing the fluid gasket material to dry to a solid gasket material.

21. The method of claim 12, wherein forming the at least one mating surface on the housing comprises molding the mating surface while molding the housing.

22. The method of claim 12, wherein the protrusions and spaces on the mating surface of the housing element are formed in a sawtooth pattern.

23. The method of claim 12, wherein the protrusions and spaces on the mating surface of the housing element are formed to have a substantially rectangular shape.

24. The method of claim 12, wherein the protrusions and spaces on the mating surface of the housing element are formed to have a substantially trapezoidal shape.

* * * * *